(12) United States Patent
Uchiyama (10) Patent No.: US 6,781,662 B1
(45) Date of Patent: Aug. 24, 2004

(54) COMPRESSION-BOND CONNECTION SUBSTRATE, LIQUID CRYSTAL DEVICE, AND ELECTRONIC EQUIPMENT

(75) Inventor: Kenji Uchiyama, Hotaka-machi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/445,102

(22) PCT Filed: Apr. 6, 1999

(86) PCT No.: PCT/JP99/01832

§ 371 (c)(1),
(2), (4) Date: Nov. 30, 1999

(87) PCT Pub. No.: WO99/53736

PCT Pub. Date: Oct. 21, 1999

(30) Foreign Application Priority Data

Apr. 9, 1998 (JP) ............................................. 10-098007

(51) Int. Cl.⁷ .......................... G02F 1/1345; H05K 1/14
(52) U.S. Cl. ...................................... 349/149; 257/668
(58) Field of Search ................................ 349/149, 150, 349/151, 152; 257/666, 668, 672, 673, 674

(56) References Cited

U.S. PATENT DOCUMENTS 4,991,001 A * 2/1991 Takubo et al. .............. 257/668
5,467,210 A * 11/1995 Kishigami .................. 349/150
6,191,838 B1 * 2/2001 Muramatsu ................. 349/149

FOREIGN PATENT DOCUMENTS

| EP | 0262580 | 9/1987 |
|---|---|---|
| JP | 63-184781 | 7/1988 |
| JP | 5-152382 | 6/1993 |
| JP | 5-53267 | 7/1993 |
| JP | 5-183247 | 7/1993 |
| JP | 6-244545 | 9/1994 |
| JP | 7-66240 | 3/1995 |
| JP | 09-148378 | 6/1997 |
| JP | 10-004122 | 1/1998 |
| JP | 10-013003 | 1/1998 |
| JP | 10-275961 | 10/1998 |
| WO | WO 95/13625 | 5/1995 |

* cited by examiner

Primary Examiner—Kenneth Parker
Assistant Examiner—Tai Duong
(74) Attorney, Agent, or Firm—Harness, Dickey & Pierce, P.L.C.

(57) ABSTRACT

In a compression-bond-connection substrate having a configuration wherein a plurality of wiring layers are formed, elevated compensation patterns having substantially the same thickness as that of backside wiring patterns are formed in positions corresponding to the backsides of substrate-side terminals to be conductively connected to opposing-side terminals on a compression-bonding-side surface of the compression-bond-connection substrate. Since uniform pressure is exerted on the substrate-side terminals when pressure is applied in compression-bonding, a highly reliable compression-bonding connected assembly can be stably obtained.

11 Claims, 8 Drawing Sheets

COMPRESSION-BOND CONNECTION SUBSTRATE, LIQUID CRYSTAL DEVICE, AND ELECTRONIC EQUIPMENT

TECHNICAL FIELD

The present invention relates to a compression-bond-connection substrate to be connected to other members by pressure-bonding. The invention also relates to a liquid crystal device comprised of the compression-bond-connection substrate. Also, the invention relates to an electronic equipment comprised of the liquid crystal device.

BACKGROUND ART

Currently, liquid crystal devices are being widely used in various types of electronic devices, such as portable telephones and portable information terminals. In most of these devices, liquid crystal devices are used to display visual information including characters, numbers, and graphical patterns.

The liquid crystal devices are generally comprised of substrates opposing each other and a liquid crystal sealed between the substrates. In the liquid crystal devices, there is a case in which a compression-bond-connection substrate is connected to either one or both of the substrates. The compression-bond-connection substrate has a drive circuit for driving the liquid crystal device. In the drive circuit, elements including IC chips and passive-element chip parts are mounted, and wiring patterns required to connect the abovementioned elements are formed. Also, substrate-side terminals are formed to conductively connect to terminals on the side of the liquid crystal device at appropriate locations on the compression-bond-connection substrate.

Compression-bonding processing conductively connects substrate-side terminals formed on the compression-bond-connection substrate to terminals formed on the substrates of the liquid crystal device (that is, opposing-side terminals). The compression-bonding processing uses an anisotropic conductive adhesive, such as an ACF (anisotropic conductive film), an ACP (anisotropic conductive paste), or an ACA (anisotropic conductive adhesive). The processing is performed in such a manner that the anisotropic conductive adhesive is sandwiched between the substrate of the liquid crystal device and the compression-bond-connection substrate, and the adhesive is then heated and pressed by using a compression-bonding tool.

As compression-bond-connection substrates, a single-sided wired type, a double-sided wired type, and a multilayer wired type can be considered. The single-sided wired type is a wiring type in which all elements, such as the drive circuit, wiring patterns, and substrate-side terminals are formed on a single side of the substrate. The double-sided wired type is a wiring type in which elements such as the drive circuit, wiring patterns, and substrate-side terminals are separated so as to be arranged on both sides of the substrate, and they become conductive through conductive throughholes as required. The multilayer wired type is a wiring type in which a wiring layer is repeatedly layered with an insulating layer therebetween, and individual layers become conductive through conductive throughholes as required.

Figure 8:
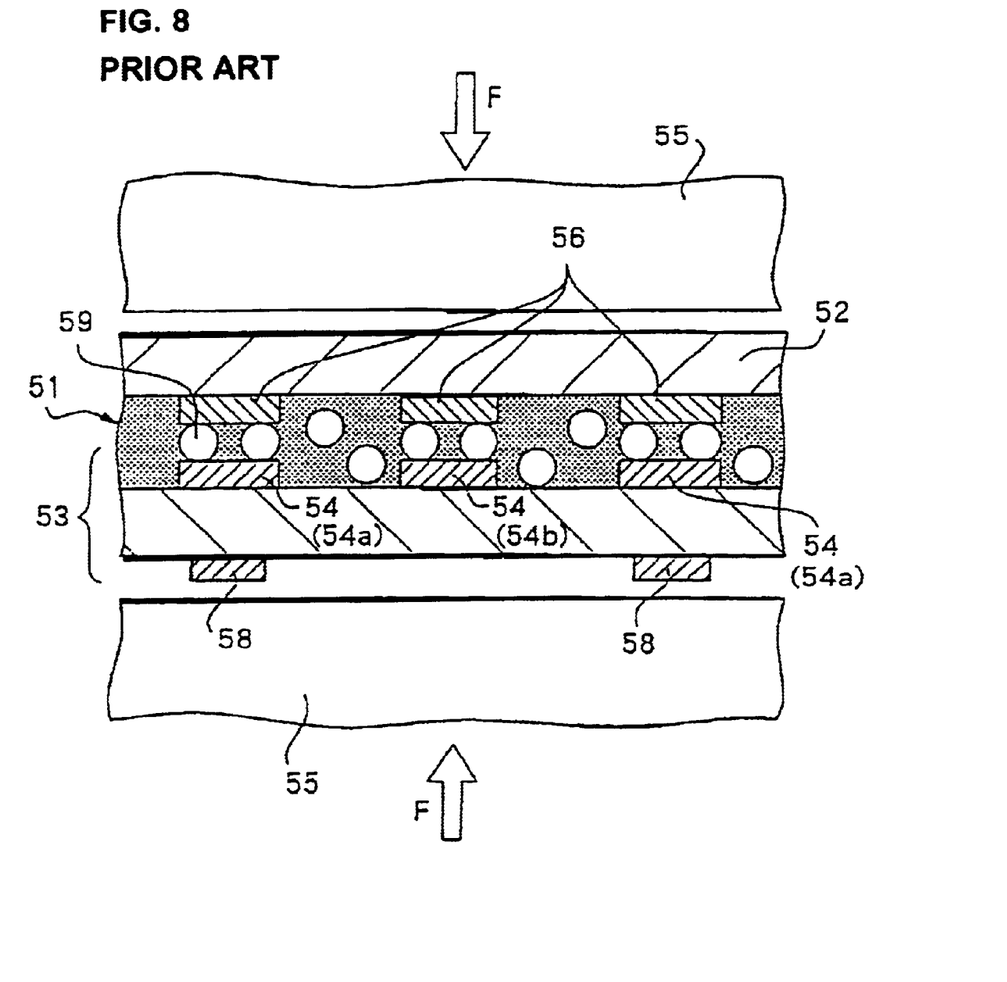
FIG. 8 a cross-sectional view showing an example of a conventional compression-bond-connection substrate.

FIG. 8 shows a state in which an ACF 51 is used to connect a compression-bond-connection substrate 53 of the double-sided wired type to a compression-bonding target object 52 by compression-bonding. In the state shown, a compression-bonding tool 55 heats the ACF 51 arranged between the compression-bonding target object 52 and the compression-bond-connection substrate 53 at a predetermined temperature and concurrently presses it with a pressure F. The ACF 51 is then caused to harden, resulting in compression-bonding of the compression-bonding target object 52 and the compression-bond-connection substrate 53. By compression-bonding, a plurality of lands 54 formed on the compression-bond-connection substrate 53 are individually conductively connected to bumps 56 of the compression-bonding target object 52 via conductive balls 59 in the ACF 51.

In the case of the aforementioned conventional compression-bond-connection substrate 53 of the double-sided wired type, however, while the lands 54 as substrate-side terminals are formed on the compression-bonding side surface, backside wiring patterns 58 are formed on the reverse side of the compression-bonding-side surface. Therefore, the plurality of lands 54 includes both types of lands 54a overlapping with the backside wiring patterns 58 and lands 54b not overlapping with the backside wiring patterns 58.

In the case of the compression-bond-connection substrate 53 as described above, when compression-bonding is carried out by using the compression-bonding tool 55, a high pressure is exerted on the lands 54a overlapping with the backside wiring patterns 58 whereas an insufficient pressure is exerted on the lands 54b not overlapping with the backside wiring patterns 58. This causes the connection between the plurality of bumps 56 and the plurality of lands 54 to be partially insufficient, significantly reducing the reliability of the connection therebetween.

A connection assembly as shown in FIG. 8 uses the compression-bond-connection substrate 53 of the double-sided wired type having a configuration in which the wiring layers are formed on both the front side and the backside of the substrate. Nevertheless, a problem similar to the above arises even in a compression-bond-connection substrate of the multilayer wired type having a configuration in which multiple wiring layers are overlaid.

The present invention is to provide a compression-bond-connection substrate such as that of a double-sided wired type or multilayer wired type that has a configuration in which multiple wiring layers are overlaid, which allows stable provision of a highly reliable compression-bonding connected assembly.

DISCLOSURE OF INVENTION

The present invention provides a compression-bond-connection substrate to be connected by compression-bonding to a compression-bonding target object having opposing-side terminals, comprising a compression-bonding-side surface to be connected to the compression-bonding target object, substrate-side terminals formed on the compression-bonding side surface to be conductively connected to the opposing-side terminals, and backside wiring patterns formed on the reverse face of the compression-bonding-side surface, characterized in that step compensation patterns having substantially the same thickness as that of the backside wiring patterns are formed on the reverse face in positions corresponding to the backsides of the substrate-side terminals.

In the present invention as described above, as shown in FIG. 5 for example, when a compression-bond-connection substrate 3 is compression-bonded with a compression-bonding target object 2, an adhesive material 1 such as an ACF is sandwiched therebetween; and furthermore, the adhesive material 1 is heated, and concurrently, both the compression-bonding target object 2 and the compression-bond-connection substrate 3 are pressed together with a pressure F. At this time, substrate-side terminals 4 formed on a compression-bonding-side surface of the compression-bond-connection substrate 3 are conductively connected to opposing-side terminals 6 formed on the compression-bonding target object 2.

Figure 5:
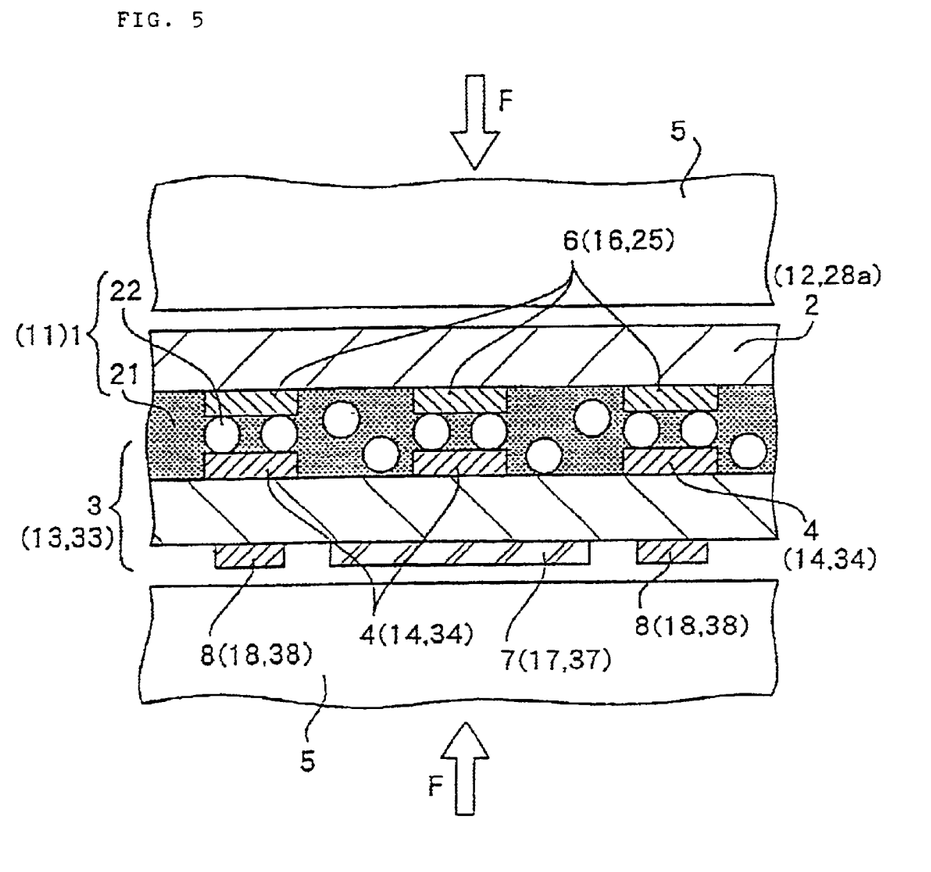
FIG. 5 is a cross-sectional view schematically showing a state of connection between the compression-bond-connection substrate and a compression-bonding target object according to the present invention.

According to the present invention, step compensation patterns 7 having the same thickness as that of backside wiring patterns 8 are formed in positions at the backsides of the substrate-side terminals 4 where the backside wiring patterns do not exist on a reverse face of the compression-bonding side surface of the compression-bond-connection substrate 3. Therefore, the pressure is applied uniformly by a compression-bonding tool 5 to the individual substrate-side terminals 4. As a result, all the individual substrate-side terminals 4 can be ensured to be conductively connected to,all the individual opposing-side terminals 6. That is, according to the compression-bond-connection substrate of the present invention, even in the case of a substrate on which a plurality of wiring patterns overlap with each other, as in a double-sided wired type or a multilayer wired type, a highly reliable compression-bonded assembly can be obtained.

Also, in the compression-bond-connection substrate having the above configuration, at least some of the step compensation patterns may be formed on the reverse face of the compression-bonding side surface in positions corresponding to the backsides of regions overlapping with a plurality of the substrate-side terminals. Even in this case, effects similar to the above case can be obtained.

Also, in the compression-bond-connection substrate having the above configuration, the compression-bonding target object may be, for example, an IC chip, and in this case, the opposing-side terminals may be considered as bumps to be formed on an active face of the IC chip.

Also, in the compression-bond-connection substrate having the above configuration, the compression-bonding target object may be, for example, a substrate of a liquid crystal panel including a pair of substrates opposing each other and a liquid crystal sealed between the substrates.

Also, in this case, the opposing-side terminals may be considered as external-connecting terminals formed on at least either one of the pair of substrates of a liquid crystal panel.

Also, the compression-bond-connection substrate having the above configuration is characterized so as to be conductively connected to the compression-bonding target object via an anisotropic conductive adhesive.

In the present invention as described above, as shown in FIG. 5 for example, the anisotropic conductive adhesive as an adhesive material 1 is sandwiched, and furthermore, the anisotropic conductive adhesive is heated, and concurrently, a compression-bonding target object 2 and the compression-bond-connection substrate 3 are pressed together with a pressure F. At this time, the substrate-side terminals 4 formed on the compression-bonding-side surface of the compression-bond-connection substrate 3 are conductively connected to the opposing-side terminals 6 formed on the compression-bonding target object 2. As a result, a highly reliable compression-bonded assembly can be obtained.

Also, the present invention provides a liquid crystal device comprising a pair of substrates opposing each other, a liquid crystal enclosed between the substrates, and a compression-bond-connection substrate connected at least to one of the pair of substrates, characterized in that the compression-bond-connection substrate is composed as described above.

According to the liquid crystal device, even in the case that a compression-bond-connection substrate connected to the liquid crystal side substrate is a substrate on which a plurality of wiring patterns overlap with each other, as in a double-sided wired type or a multilayer wired type, a highly reliable compression-bonded assembly can be obtained. Therefore, occurrence of display defects due to failed electrical conductivity can be avoided.

Also, the present invention provides an electronic equipment comprised of a liquid crystal device, characterized in that the liquid crystal device is as described above, allowing provision of an electronic equipment in which effects similar to the above can be obtained. As electronic devices of this type, devices such as portable telephones and portable information terminals can be considered.

BEST MODE FOR CARRYING OUT THE INVENTION

Embodiments of the present invention are described below with reference to the drawings.

First Embodiment

Figure 1:
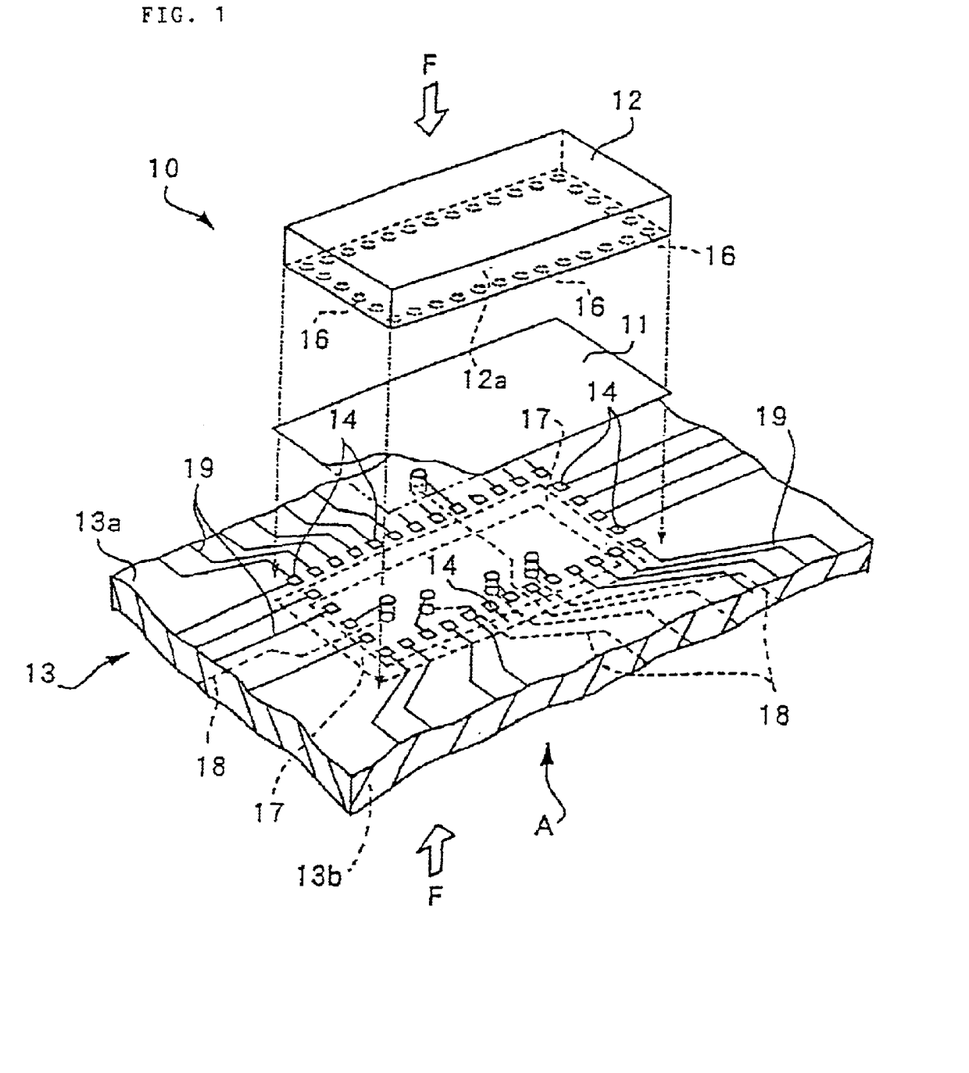
FIG. 1 is an exploded perspective view of an embodiment of a compression-bond-connection substrate according to the present invention.

FIG. 1 shows a compression-bonded connected assembly composed by use of a compression-bond-connection substrate of an embodiment according to the present invention. A compression-bonded connected assembly 10 shown in the drawing is manufactured by mounting an IC chip 12 as a compression-bonding target object onto a compression-bond-connection substrate 13.

The compression-bond-connection substrate 13 comprises a compression-bonding-side surface 13a to be connected to the IC chip 12, and a plurality of wiring patterns 19 is formed by a known patterning process on the compression-bonding-side surface 13a. At the inner ends of the wiring patterns 19, lands 14 are formed as substrate-side terminals.

Figure 2:
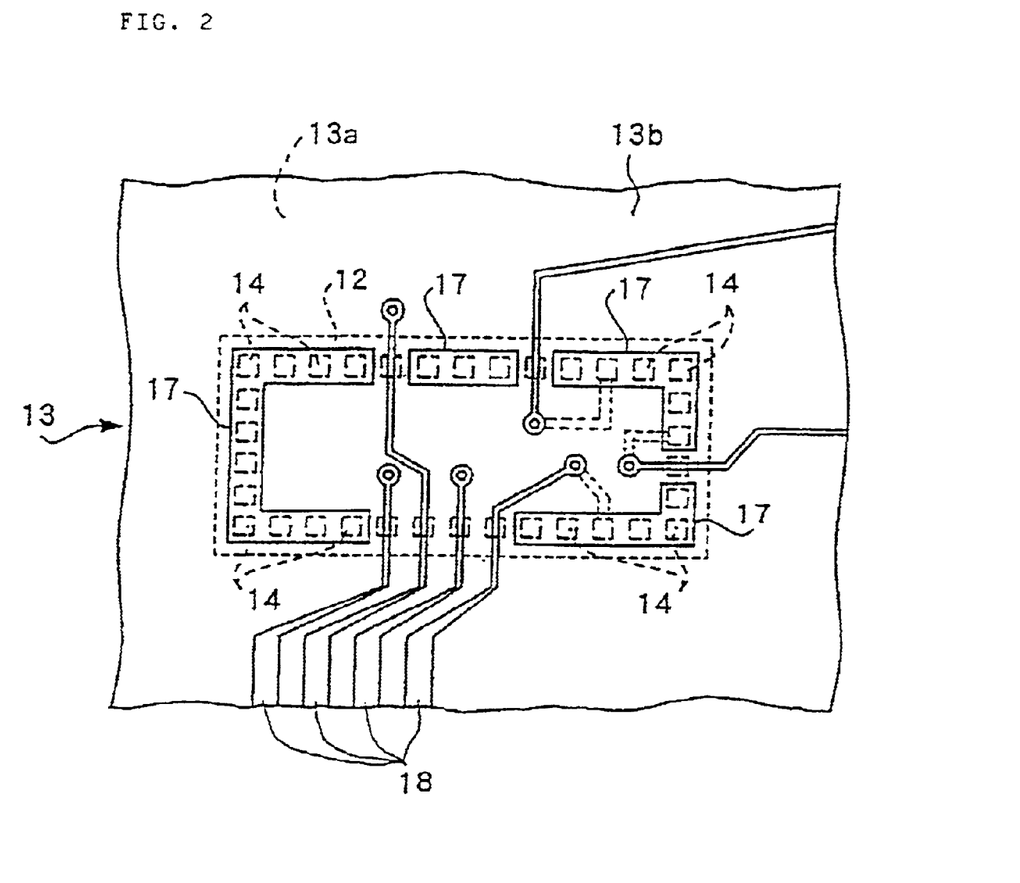
FIG. 2 is a bottom plan view taken according to arrow A in FIG. 1.

The compression-bond-connection substrate 13 of this embodiment is a substrate of a double-sided wired type, and backside wiring patterns 18 are formed on the reverse face 13b of the compression-bonding-side surface 13a. FIG. 2 shows the reverse face 13b of the compression-bond-connection substrate 13, as viewed from the direction indicated by the arrow A shown in FIG. 1. As is apparent in the drawing, the backside wiring patterns 18 are formed so as to pass through backside positions of the lands 14 on the compression-bonding-side surface 13a.

Also, in the present invention, step compensation patterns 17 are formed in portions where the backside wiring patterns 18 do not exist in positions corresponding to the backside of the lands 14 on the reverse face 13b of the compression-bond-connection substrate 13. These compensation patterns 17 can be formed at the same time when the backside wiring patterns 18 are formed. Alternatively, they may also be formed in a different step from that for the backside wiring patterns 18.

For reference, the wiring patterns 19 are schematically shown in FIG. 1, therefore actual wiring thereof is not illustrated sufficiently in detail. Also, the wiring patterns 19 in positions overlapping with the backside wiring patterns 18 are partly omitted for ease of understanding of the configuration. Also, the lands 14 are actually small, and the number thereof is actually large. However, it is shown schematically in FIG. 1.

Also, the step compensation patterns 17 are shown in FIG. 2 such that they are formed in positions corresponding to the backsides of regions overlapping with a plurality of the lands 14 for which the backside wiring patterns 18 do not exist. However, the arrangement is not restricted thereto. The step compensation patterns 17 may be arranged individually in the positions corresponding to the backsides of the regions overlapping with the plurality of lands 14 among the lands 14 and where the backside wiring patterns 18 do not exist. Alternatively, they may be arranged in a manner combined with the above manner.

The compression-bond-connection substrate 13 of the present invention is arranged as described above. Therefore, when the IC chip 12 is connected to this substrate, an anisotropic conductive adhesive such as an ACF 11 is pre-adhered on the lands 14 formed on a compression-bonding-side surface of the compression-bond-connection substrate 13, and an active face 12a of the IC chip 12 is fitted on the ACF 11. At this time, the relative position of the IC chip 12 and the compression-bond-connection substrate 13 is determined so that the positions of the bumps 16 as opposing-side terminals formed on the active face 12a and the lands 14 on the side of the compression-bond-connection substrate 13 are aligned with each other.

Consecutively, a compression-bonding tool (not shown) heated at a high temperature is used to press outer sides of the compression-bond-connection substrate 13 and the IC chip 12 with a pressure F. As shown in FIG. 5, the heating and pressuring processing and an adhesive portion 21 serve to bond the IC chip 12 and the compression-bond-connection substrate 13 together, and furthermore, conductive balls 22 of the ACF 11 serve to electliccaly conductively connect the bumps 16 and the lands 14.

Also, in the present invention, the step compensation patterns 17 compensating the step due to the thickness of the backside wiring pattern and having the same thickness as that of the backside wiring patterns 18 are formed in the backside positions of the lands 14 where the backside wiring patterns 18 do not exist. Therefore, the pressure is uniformly distributed to the plurality of lands 14 in compression-bonding processing, resulting in complete conductive connection of all the lands 14 to the bumps 16. This allows the manufacture of the compression-bonded connected assembly 10 having high connection reliability.

Second Embodiment

Figure 3:
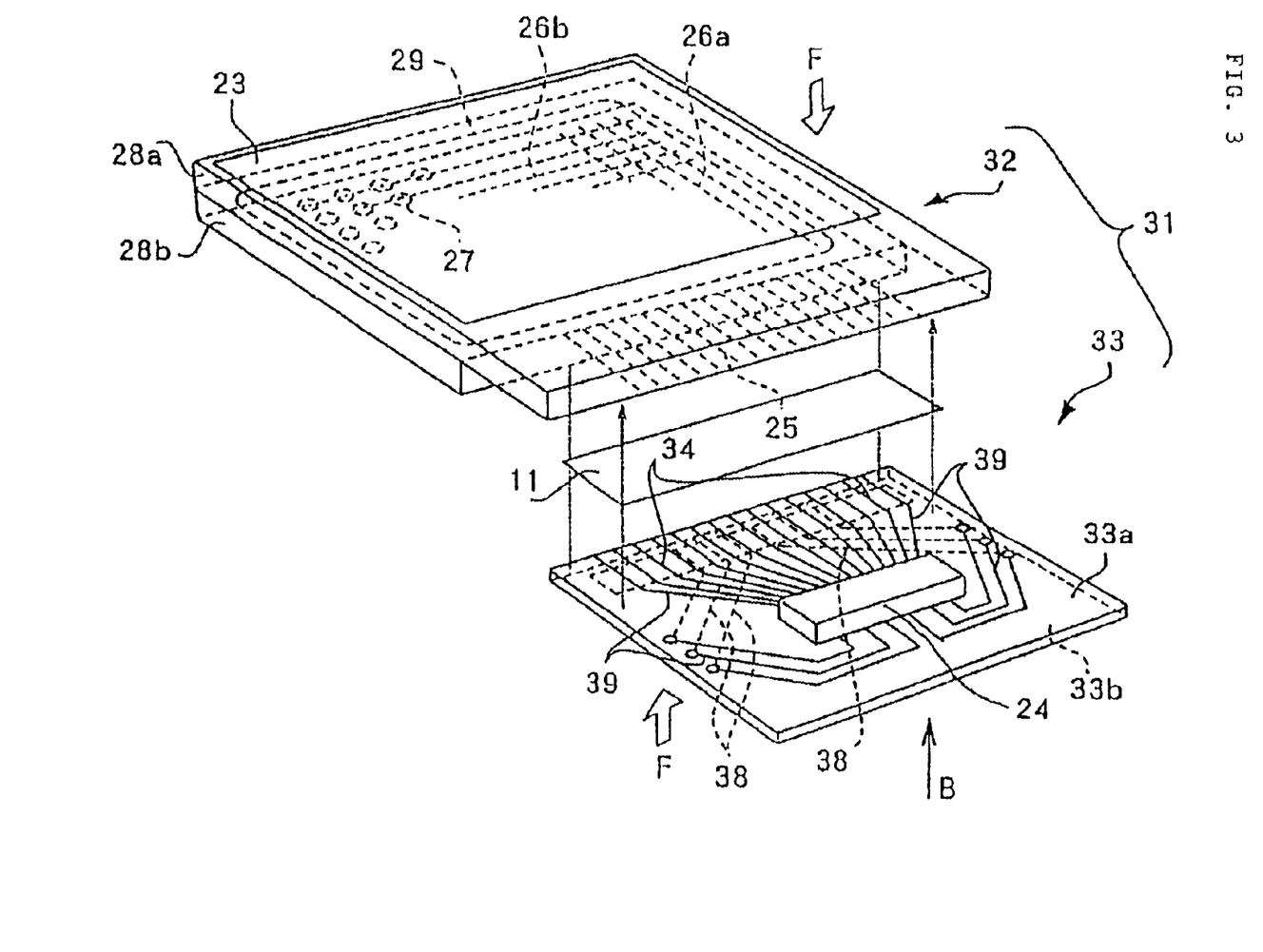
FIG. 3 is an exploded perspective view showing an another embodiment of a compression-bond-connection substrate according to the present invention, and an embodiment of a liquid crystal device according to the present invention.

FIG. 3 shows an embodiment of a liquid crystal device configured by using a compression-bond-connection substrate of a different embodiment according to the present invention. A liquid crystal device 31 shown in the drawing includes a liquid crystal panel 32 and a compression-bond-connection substrate 33 to be connected thereto. The liquid crystal panel 32 includes substrates 28a and 28b bonded together via a circular sealing material 29 and a liquid crystal 27 sealed between the substrates. The substrates 28a and 28b are formed of materials such as glass and plastics.

In the drawing, electrodes 26a and external-connecting terminals 25 as opposing-side terminals are formed on an inner surface of the upper-side substrate 28a, and electrodes 26b are formed on an inner surface of the lower-side substrate 28b. The electrodes 26a and 26b and the external-connecting terminals 25 are formed of a material such as ITO (indium tin oxide). The electrodes 26a on the side of the substrate 28a is directly connected to the external-connecting terminals 25, and the opposing electrodes 26b of the substrate 28b is connected to the external-connecting terminals 25 via a conductive material (not shown) arranged between the substrate 28a and the substrate 28b. A polarizer 23 is pasted on an outer surface of the substrates 28a.and 28b. Actually, a large number of each of the electrodes 26a, the electrodes 26b, and external-connecting terminals 25 are to be formed, but the drawing schematically shows some of them, omitting the remainder. Also omitted are illustrations of the manner of connection between the electrodes 26a and the external-connecting terminals 25, and the manner of connection between the electrodes 26b and the external-connecting terminals 25.

The compression-bond-connection substrate 33 includes a compression-bonding-side surface 33a to be connected to the substrate 28a as a compression-bonding target object. On this compression-bonding-side surface 33a, a plurality of wiring patterns 39 is formed by a known patterning processing. Substrate-side terminals 34 are formed at appropriate locations in the wiring patterns 39. Also, an IC 24 for liquid crystal driving is mounted by face down bonding at an appropriate location on-the compression-bond-connection substrate 33.

Figure 4:
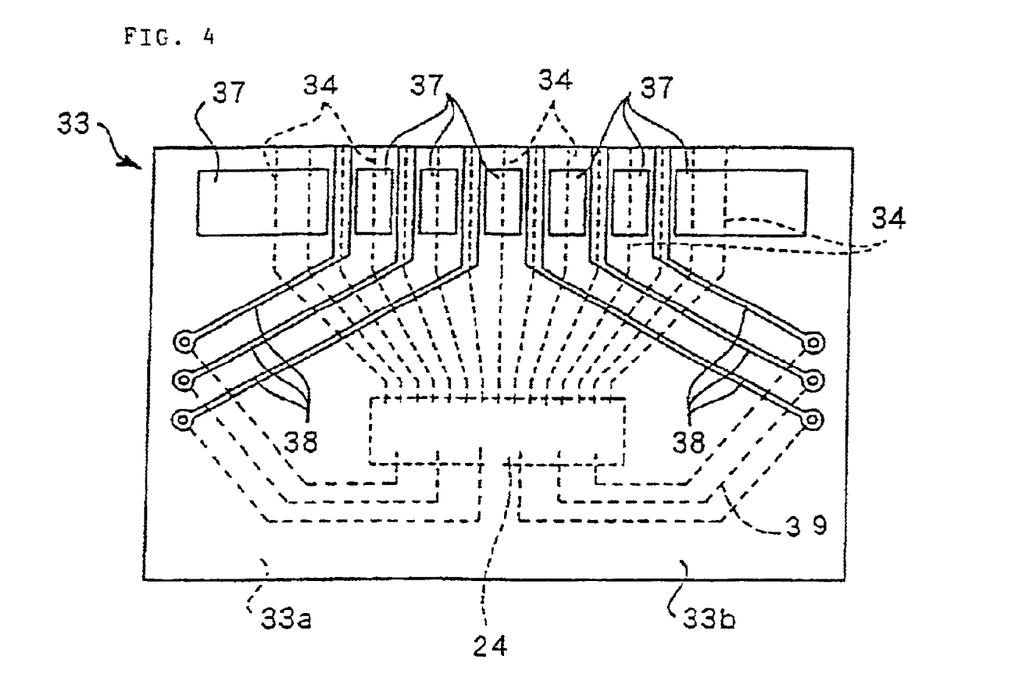
FIG. 4 is a bottom plan view taken according to arrow B in FIG. 3.

The compression-bond-connection substrate 33 of this embodiment is a substrate of a double-sided wired type, and backside wiring patterns 38 are formed on the reverse face 33b of the compression-bonding-side surface 33a. FIG. 4 shows the reverse face 33b of the compression-bond-connection substrate 33, as viewed from the direction indicated by the arrow B shown in FIG. 3. As is apparent in the drawing, the backside wiring patterns 38 are formed so as to pass through backside positions of substrate-side terminals 34 on the compression-bonding- side surface 33a.

Also, in the present invention, step compensation patterns 37 are formed in portions where the backside wiring patterns 38 do not exist in positions corresponding to the backside of the substrate-side terminals 34 on the reverse face 33b of the compression-bond-connection substrate 33. These step compensation patterns 37 can be formed at the same time when the backside wiring patterns 38 are formed. Alternatively, they may be formed in a different step from that for the backside wiring patterns 38. For reference, the wiring patterns 39 are schematically shown in FIG. 3, and therefore, actual wiring thereof is not illustrated sufficiently in detail.

Also, in FIG. 4, the step compensation patterns 37 are shown in a combined manner such that they are formed in positions, corresponding to the individual backsides of the substrate-side terminals 34 among the substrate-side terminals 34, for which the backside wiring patterns 38 do not exist and they are formed in positions corresponding to the backside of the regions overlapping with a plurality of the substrate-side terminals 34. However, the arrangement is not restricted to the combination. For example, the step compensation patterns 37 may be arranged individually in the positions corresponding to all the individual substrate-side terminals 34 for which the backside wiring patterns 38 do not exist.

When the compression-bond-connection substrate 33 is connected to the substrate 28a as the compression-bonding target object, an anisotropic conductive adhesive such as ACF 11 is pre-adhered on the substrate-side terminals 34 formed on a compression-bonding-side surface of the compression-bond-connection substrate 33, and the substrate 28a of the liquid crystal panel 32 is mounted on the ACF 11. At this time, the relative position of the liquid crystal panel 32 and the compression-bond-connection substrate 33 is determined so that the positions of the external-connecting terminals 25 on the substrate 28a and the substrate side terminals 34 of the compression-bond-connection substrate 33 side are aligned with each other.

Consecutively, a compression-bonding tool, (not shown) heated at a high temperature is used to press the outer sides of the compression-bond-connection substrate 33 and the liquid crystal panel 32 with a pressure F. As shown in FIG. 5, the heating and pressuring processing and an adhesive portion 21 serve to bond the substrate 28a and the compression-bond-connection substrate 33 together, and furthermore, conductive balls 22 of the ACF 11 serve to conductively connect the external-connecting terminals 25 and the substrate-side terminals 34.

Also, in the present invention, the step compensation patterns 37 having the same thickness as that of the backside wiring patterns 38 are formed in the backside positions of the substrate-side terminals 34 where the backside wiring patterns 38 do not exist. Therefore, the pressure is uniformly distributed to the plurality of substrate-side terminals 34 in compression-bonding, resulting in complete conductive connection of all the substrate-side terminals 34 to the external-connecting terminals 25. This allows the manufacture of the liquid crystal device 31 having high connection reliability.

Third Embodiment

Figure 6:
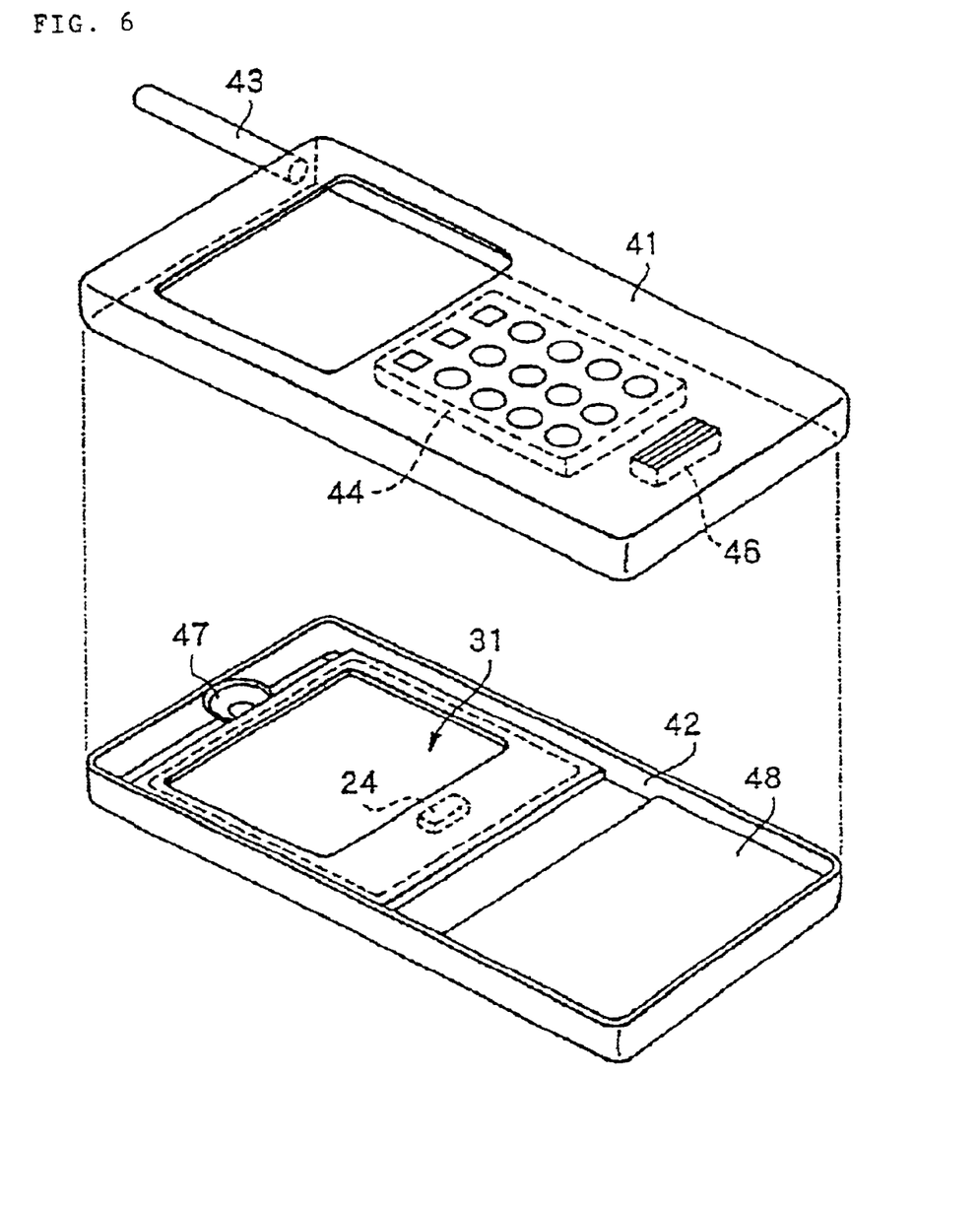
FIG. 6 is an exploded perspective view of an embodiment of an electronic equipment according to the present invention.

FIG. 6 shows an electronic equipment of an embodiment according to the present invention. In this embodiment, a liquid crystal device of the present invention is applied to a portable telephone as an electronic equipment. The portable telephone shown in the figure is comprised of an upper housing 41 and a lower housing 42., The upper housing 41 includes a transmitting/receiving antenna 43, a keyboard unit 44, and a microphone 46. The lower housing 42 includes a liquid crystal device 31 as shown, for example, in FIG. 3, a speaker 47, and a circuit substrate 48.

Figure 7:
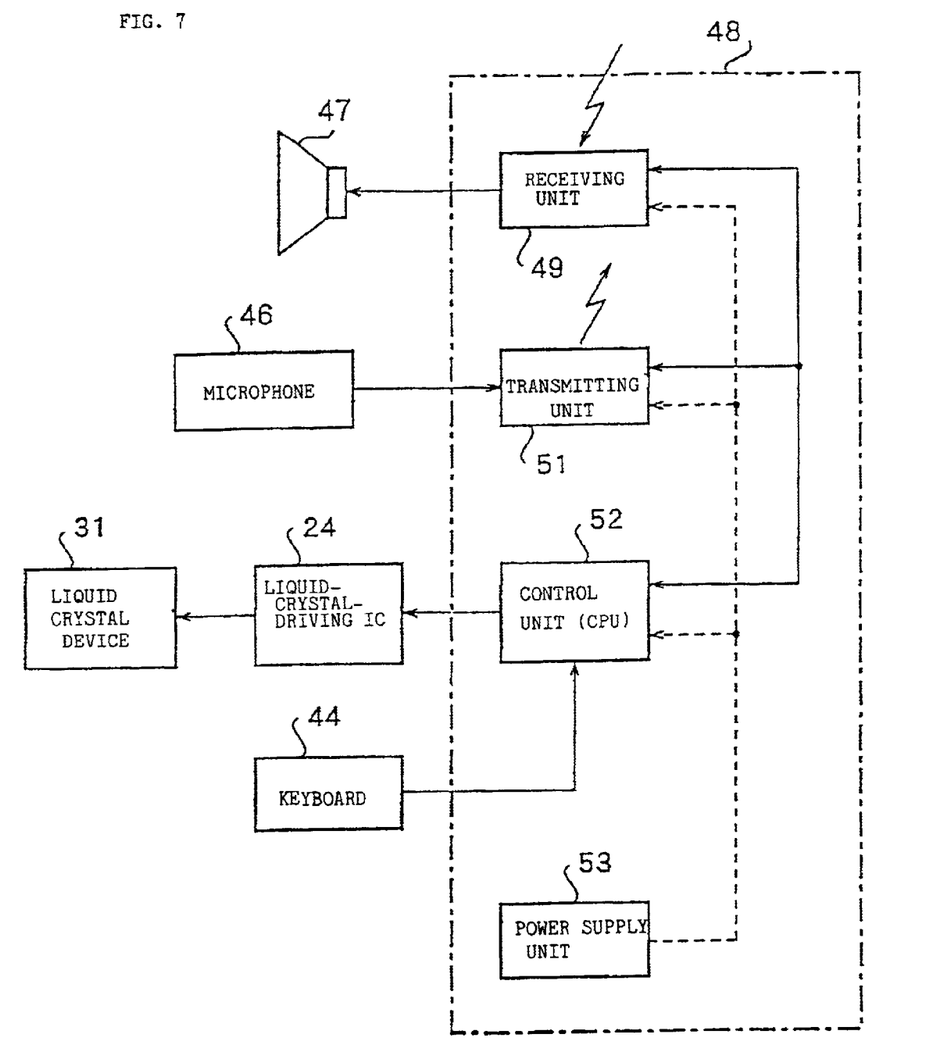
FIG. 7 is a block diagram showing an example of an electric control system used in the electronic equipment in FIG. 6.

As shown in FIG. 7, on the circuit substrate 48, there are arranged a receiving unit 49 connected to an input terminal of the speaker 47, a transmitting unit 51 connected to an output terminal of the microphone 46, a control unit 52 comprised of a CPU, and a power supply unit 53 for supplying power to the individual units. The control unit 52 reads a status in the transmitting unit 51 and receiving unit 49, and based on the result, it feeds information to the liquid-crystal-driving IC 24 so that visual information such as characters and numbers is displayed in a display region of the liquid crystal device 31. Also, based on information output from the keyboard unit 44, the control unit 52 feeds information to the liquid-crystal-driving IC 24 so that the visual information is displayed in the display region of the liquid crystal device 31.

Other Embodiments

The present invention has been described with reference to the preferred embodiments, however, the invention is not restricted to the embodiments, and it may be modified in various ways within the scope of the invention.

For example, in the compression-bond-connection substrate in FIGS. 1 and 3, the compression-bond-connection substrate of the double-sided wired type is described. However, the present invention may of course be applied to a substrate of the multilayer wired type on which three or more wiring layers are overlaid. Also, in the liquid crystal device shown in FIG. 3, the invention is applied to the liquid crystal device of a passive matrix type, but the invention may be applied to a liquid crystal device of an active matrix type.

What is claimed is:

1. A connection assembly comprising:

a substrate having first and second sides;

a target object opposed to the first side of the substrate;

plurality of target object-side terminals formed on the target object;

a plurality of substrate side terminals formed on the first side of the substrate, and opposed to the target object-side terminals;

an adhesive material disposed between the substrate and the target object;

a plurality of wirings formed on the second side of said substrate; and a compensation member formed on the second side of the substrate, the compensation member having substantially the same thickness as the wirings.

2. A connection assembly comprising:

a substrate having first and second sides;

an IC chip opposed to the first side of the substrate;

a plurality of bumps formed on the IC chip;

a plurality of lands formed on the first side of the substrate, and opposed to the bumps;

an adhesive material disposed between the substrate and the IC chip;

a plurality of wirings formed on the second side of the substrate; and a compensation member formed on the second side of the substrate, the compensation member having substantially the same thickness as the wirings.

3. A compression-bond-connection substrate to be connected by compression-bonding to a compression-bonding target object having opposing-side terminals, comprising a compression-bonding-side surface to be connected to the compression-bonding target object, substrate-side terminals to be conductively connected to the opposing-side terminals, and backside wiring patterns formed on a reverse face of the compression-bonding-side surface, characterized in that step compensation patterns having substantially the same thickness as that of the backside wiring patterns are formed on the reverse face in positions corresponding to the backsides of the substrate-side terminals.

4. A compression-bond-connection substrate as stated in claim 3, characterized in that at least some of the step compensation patterns are formed on the reverse face in positions corresponding to the backsides of regions overlapping with a plurality of the substrate-side terminals.

5. A compression-bond-connection substrate as stated in claim 3, characterized in that the compression-bonding target object is an IC chip, and the opposing-side terminals are bumps to be formed on an active face of the IC chip.

6. A compression-bond-connection substrate as stated in claim 3, characterized in that the compression-bonding target object is a substrate of a liquid crystal panel comprising a pair of substrates opposing each other and a liquid crystal sealed between the substrates, and the opposing-side terminals are external-connecting terminals formed on at least one of the substrates.

7. A compression-bond-connection substrate as stated in claim 3, characterized so as to be conductively connected to the compression-bonding target object via an anisotropic conductive adhesive.

8. A compression-bond-connection substrate as stated in claim 3, characterized in that the compression-bonding target object is a liquid crystal device including a pair of substrates opposing each other and a liquid crystal sealed between the substrates.

9. An electronic equipment comprising a liquid crystal device, characterized in that the liquid crystal device is as stated in claim 8.

10. A liquid crystal device comprising:

a substrate having first and second sides;

a liquid crystal panel opposed to the first side of the substrate;

a plurality of external-connecting terminals formed on the liquid crystal panel;

a plurality of substrate-side terminals formed on the first side of the substrate and opposed to the external-connecting terminals;

an adhesive material disposed between the substrate and the liquid crystal panel;

a plurality of wirings formed on the second side of the substrate; and a compensation member formed on the second side of the substrate;

wherein the compensation member has substantially the same thickness as the wirings.

11. The liquid crystal device of claim 10, characterized in that said adhesive material is an anisotropic conductive adhesive.

* * * * *